US009835944B2

(12) United States Patent
Sakai et al.

(10) Patent No.: US 9,835,944 B2
(45) Date of Patent: Dec. 5, 2017

(54) LIQUID SOLDER RESIST COMPOSITION AND COVERED-PRINTED WIRING BOARD

(71) Applicant: GOO CHEMICAL CO., LTD., Kyoto (JP)

(72) Inventors: Yoshio Sakai, Shiga (JP); Nobuhito Hamada, Kyoto (JP); Michiya Higuchi, Kyoto (JP); Tokuzan Miyake, Kyoto (JP)

(73) Assignee: GOO CHEMICAL CO., LTD., Kyoto (JP)

( * ) Notice: Subject to any disclaimer, the term of this patent is extended or adjusted under 35 U.S.C. 154(b) by 0 days.

(21) Appl. No.: 14/651,193

(22) PCT Filed: Dec. 10, 2014

(86) PCT No.: PCT/JP2014/006157
§ 371 (c)(1),
(2) Date: Jun. 10, 2015

(87) PCT Pub. No.: WO2016/092595
PCT Pub. Date: Jun. 16, 2016

(65) Prior Publication Data
US 2016/0342085 A1 Nov. 24, 2016

(51) Int. Cl.
| | |
|---|---|
| G03F 7/038 | (2006.01) |
| G03F 7/26 | (2006.01) |
| G03F 7/031 | (2006.01) |
| H05K 1/02 | (2006.01) |
| H05K 3/28 | (2006.01) |
| G03F 7/004 | (2006.01) |
| G03F 7/20 | (2006.01) |
| H05K 1/03 | (2006.01) |

(52) U.S. Cl.
CPC ............ *G03F 7/031* (2013.01); *G03F 7/0042* (2013.01); *G03F 7/038* (2013.01); *G03F 7/20* (2013.01); *G03F 7/26* (2013.01); *H05K 1/02* (2013.01); *H05K 1/0274* (2013.01); *H05K 1/0353* (2013.01); *H05K 3/282* (2013.01); *H05K 3/287* (2013.01); *H05K 2201/0166* (2013.01); *H05K 2201/068* (2013.01)

(58) Field of Classification Search
None
See application file for complete search history.

(56) References Cited

U.S. PATENT DOCUMENTS

| | | | |
|---|---|---|---|
| 6,099,123 A * | 8/2000 | Engardio | C08F 283/01 264/1.1 |
| 6,238,840 B1 | 5/2001 | Hirayama et al. | |
| 6,465,540 B1 | 10/2002 | Kubo et al. | |
| 6,498,883 B1 * | 12/2002 | Wilson | C08K 5/0041 385/114 |
| 6,562,464 B1 | 5/2003 | Schwalm et al. | |
| 7,329,713 B2 * | 2/2008 | Schorr | C08K 5/0025 522/101 |
| 8,940,804 B2 * | 1/2015 | Rrahimi | C09D 11/101 520/1 |
| 2003/0100627 A1 * | 5/2003 | Bishop | C03C 25/106 522/153 |
| 2003/0109599 A1 * | 6/2003 | Kamen | C09D 11/101 523/160 |
| 2004/0151843 A1 * | 8/2004 | Weingartz | B05D 3/0209 427/553 |
| 2004/0152798 A1 * | 8/2004 | Weissman | C08F 2/50 522/8 |
| 2004/0206123 A1 | 10/2004 | Fotheringham et al. | |
| 2005/0228062 A1 | 10/2005 | Wolf et al. | |
| 2006/0060841 A1 | 3/2006 | Kim et al. | |
| 2007/0134847 A1 | 6/2007 | Kang et al. | |
| 2007/0264601 A1 | 11/2007 | Uematsu et al. | |
| 2008/0090930 A1 | 4/2008 | Madhusoodhanan et al. | |
| 2009/0087759 A1 | 4/2009 | Matsumoto et al. | |
| 2009/0099330 A1 | 4/2009 | Okada et al. | |
| 2010/0022676 A1 | 1/2010 | Rogers et al. | |
| 2010/0027950 A1 | 2/2010 | Suzumura et al. | |
| 2010/0209843 A1 | 8/2010 | Sato | |
| 2010/0329616 A1 | 12/2010 | Chen et al. | |
| 2011/0218266 A1 | 9/2011 | Studer et al. | |

(Continued)

FOREIGN PATENT DOCUMENTS

| | | |
|---|---|---|
| CN | 1267688 A | 8/2000 |
| CN | 1511116 A | 7/2004 |

(Continued)

OTHER PUBLICATIONS

CIBA, Photoinitators for UV curing (2000) 15 pages.*
Machine translation of JP 2012-078414 (2012).*
International Search Report for he Application No. PCT/JP2014/006157 dated Jan. 13, 2015.
The First Office Action for the Application No. 201480003728.8 from the State Intellectual Property Office of the People's Republic of China dated Sep. 7, 2016.
Taiwanese Office Action and Search Report for the Application No. 103146118 dated Nov. 11, 2015.
Notification of Reasons for Refusal for the Application No. 2016-507921 from Japan Patent Office dated May 24, 2016.

(Continued)

*Primary Examiner* — Martin Angebranndt
(74) *Attorney, Agent, or Firm* — Cheng Law Group, PLLC

(57) ABSTRACT

A liquid solder resist composition contains a carboxyl group-containing resin, a photopolymerizable compound containing at least one compound selected from a group consisting of a photopolymerizable monomer and a photopolymerizable prepolymer, a photopolymerization initiator, and a titanium dioxide. The photopolymerization initiator contains a bisacylphosphine oxide-based photopolymerization initiator, a first α-hydroxyalkyl phenone-based photopolymerization initiator that is a liquid at 25° C., and a second α-hydroxyalkyl phenone-based photopolymerization initiator that is a solid at 25° C.

7 Claims, No Drawings

(56) References Cited

U.S. PATENT DOCUMENTS

| | | | |
|---|---|---|---|
| 2012/0148833 A1* | 6/2012 | Cao | B05D 3/067 428/334 |
| 2012/0178020 A1 | 7/2012 | Lawton et al. | |
| 2012/0270961 A1 | 10/2012 | Kotani | |
| 2013/0116358 A1 | 5/2013 | Rrahimi | |
| 2014/0154471 A1 | 6/2014 | Kodama et al. | |
| 2014/0186768 A1 | 7/2014 | Kwon et al. | |
| 2014/0220367 A1* | 8/2014 | Neddersen | G11B 7/256 428/457 |
| 2014/0308613 A1 | 10/2014 | Higuchi et al. | |
| 2014/0336298 A1* | 11/2014 | Hiraoka | C09D 11/101 522/42 |
| 2015/0304639 A1* | 10/2015 | Lin | B41M 3/003 345/419 |
| 2017/0017152 A1 | 1/2017 | Sakai | |
| 2017/0269477 A1 | 9/2017 | Higuchi et al. | |

FOREIGN PATENT DOCUMENTS

| | | | |
|---|---|---|---|
| CN | 101044434 A | | 9/2007 |
| CN | 101321727 A | | 12/2008 |
| CN | 103746131 A | | 4/2014 |
| CN | 103881473 | * | 6/2014 |
| JE | 2012-53229 A | | 3/2012 |
| JP | 2002-540243 A | | 11/2002 |
| JP | 2005-523923 A | | 8/2005 |
| JP | 2006-64890 A | | 3/2006 |
| JP | 2007-322546 | * | 12/2007 |
| JP | 2008-107511 A | | 5/2008 |
| JP | 4538521 B2 | | 9/2010 |
| JP | 2010-266556 A | | 11/2010 |
| JP | 2011-227343 A | | 11/2011 |
| JP | 2012-78414 A | | 4/2012 |
| JP | 2012-108523 A | | 6/2012 |
| JP | 2012-215716 A | | 11/2012 |
| JP | 2013-36027 A | | 2/2013 |
| JP | 2013-137373 A | | 7/2013 |
| JP | 2013-210443 A | | 10/2013 |
| JP | 2014-63158 A | | 4/2014 |
| JP | 2015-41058 A | | 3/2015 |
| KR | 10-2010-0024893 A | | 3/2010 |
| KR | 10-2010-0087246 A | | 8/2010 |
| TW | 200908839 A | | 2/2009 |
| TW | 201033161 A | | 9/2010 |
| TW | 201335213 A1 | | 9/2013 |
| WO | WO-2008/029816 A1 | | 3/2008 |
| WO | WO-2013/048615 A1 | | 4/2013 |
| WO | WO-2014/132928 A1 | | 9/2014 |
| WO | WO-2015/060240 A1 | | 4/2015 |
| WO | WO-2016/092595 A1 | | 6/2016 |
| WO | WO-2016/092718 A1 | | 6/2016 |

OTHER PUBLICATIONS

The First Office Action for the Application No. 201580015114.6 from the State Intellectual Property Office of the People's Republic of China dated Jan. 22, 2017.
Taiwanese Office Action for Application No. 105115063 dated Dec. 30, 2016 with English Translation of Search Report.
Non-Final Office Action for U.S. Appl. No. 15/124,469 from the U.S. Office dated Feb. 23, 2017.
Notification of Reasons for Refusal for the Application No. 2015-561787 from Japan Patent Office dated Mar. 8, 2016.
International Search Report (with PCT/ISA/237) for Application No. PCT/JP2015/004080 dated Nov. 10, 2015.
Supplementary European Search Report for the Application No. EP 15 86 7418 dated Feb. 8, 2017.
Final Office Action for U.S. Appl. No. 15/124,469 from the U.S. Office dated Jul. 12, 2017.
Supplementary European Search Report for the Appiication No. EP 15 86 8034 dated Aug. 24, 2017.
Non-Final Office Action for the U.S. Appl. No. 15/532,978 from the United States Patent and Trademark Office dated Oct. 6, 2017,.

* cited by examiner

LIQUID SOLDER RESIST COMPOSITION AND COVERED-PRINTED WIRING BOARD

TECHNICAL FIELD

The present invention relates to a liquid solder resist composition and a covered-printed wiring board, and specifically relates to a liquid solder resist composition that has photocurability and can be developed using an alkaline solution, and a covered-printed wiring board that includes a solder resist layer made of the liquid solder resist composition.

BACKGROUND ART

In recent years, as a method for forming solder resist layers on printed-wiring boards for consumer use and industrial use, a method using a liquid solder resist composition that has excellent resolution, size precision, and the like, and can be developed has been widely adopted, instead of a screen printing method, in order to increase the density of wiring on the printed-wiring board.

Also, in recent years, optical elements such as light-emitting diodes are often mounted directly on a printed-wiring board on which a solder resist layer is formed to cover the printed-wiring board, for uses in: backlights of liquid crystal displays of mobile terminals, personal computers, televisions, and the like; light sources of illumination devices; and the like. Furthermore, as a result of the solder resist layer of the printed-wiring board on which optical elements are mounted containing titanium dioxide, the solder resist layer is whitened, which allows light emitted from light-emitting elements to efficiently reflect off the solder resist layer (see JP2012-78414A).

However, if the liquid solder resist composition contains titanium dioxide, when this liquid solder resist composition is exposed to light so as to be cured, the contained titanium dioxide may reflect or absorb light and possibly interfere curing of the liquid solder resist composition. In particular, if the liquid solder resist composition contains a large amount of titanium dioxide, it is difficult for a lower portion of the solder resist layer made of the liquid solder resist composition to be cured. If the lower portion of the solder resist layer is not sufficiently cured, poor quality is likely to occur, such as deterioration of resolution of the developed solder resist layer, occurrence of wrinkles in the solder resist layer due to a difference in shrinkage during curing between the lower portion and upper portion of the solder resist layer, and cracks due to the partial concentration of stress resulting from a difference in thermal expansion coefficients between the lower portion and the upper portion when the solder resist layer is heated.

Also, good storage stability is required for the liquid solder resist composition, and a low tackiness of the coating film made of the liquid solder resist composition is also required.

SUMMARY OF INVENTION

The present invention has been made in light of the above-described circumstances, and it is an object thereof to provide a liquid solder resist composition that has good storage stability, forms a coating film having a low tackiness when the coating film is formed, and allows sufficient curing of the coating film from its upper portion to its lower portion when the coating film is exposed to light, and to provide a covered-printed wiring board including a solder resist layer made of the liquid solder resist composition.

The liquid solder resist composition according to the present invention includes a carboxyl group-containing resin, a photopolymerizable compound containing at least one compound selected from a group consisting of a photopolymerizable monomer and a photopolymerizable prepolymer, a photopolymerization initiator, and a titanium dioxide, and the photopolymerization initiator contains a bisacylphosphine oxide-based photopolymerization initiator, a first α-hydroxyalkyl phenone-based photopolymerization initiator that is a liquid at 25° C., and a second α-hydroxyalkyl phenone-based photopolymerization initiator that is a solid at 25° C.

The covered-printed wiring board according to the present invention includes a printed-wiring board and a solder resist layer that covers the printed-wiring board, and the solder resist layer is made of the above-described liquid solder resist composition.

DESCRIPTION OF EMBODIMENTS

An embodiment for implementing the present invention will now be described. It should be noted that in description below, "(meth)acryl" means at least one of "acryl" and "methacryl". For example, (meth)acrylate means at least one of acrylate and methacrylate.

The liquid solder resist composition according to this embodiment contains a carboxyl group-containing resin, a photopolymerizable compound containing at least one of a compound selected from a group consisting of a photopolymerizable monomer and a photopolymerizable prepolymer, a photopolymerization initiator, and a titanium dioxide. The photopolymerization initiator contains a bisacylphosphine oxide-based photopolymerization initiator, a first α-hydroxyalkyl phenone-based photopolymerization initiator that is a liquid at 25° C., and a second α-hydroxyalkyl phenone-based photopolymerization initiator that is a solid at 25° C.

Because the photopolymerization initiator in the liquid solder resist composition according to the present embodiment contains three specific types of components in this manner, in the liquid solder resist composition according to the present embodiment, crystals of the bisacylphosphine oxide-based photopolymerization initiator are unlikely to be precipitated, and thus the liquid solder resist composition has good storage stability. Also, a coating film made of the liquid solder resist composition has low tackiness, and thus the coating film can be handled easily and the workability is improved when a solder resist layer is formed. Furthermore, when this coating film is exposed to ultraviolet rays, a photo-curing reaction efficiently progresses entirely from the upper portion of the coating film to the lower portion thereof.

As described above, according to the present embodiment, the liquid solder resist composition can be obtained that has good storage stability, forms a coating film having a low tackiness when the coating film is formed, and also allows sufficient curing of the coating film from its upper portion to its lower portion when the coating film is exposed to light.

The liquid solder resist composition according to the present embodiment will now be further described more specifically.

The carboxyl group-containing resin can provide the coating film made of the liquid solder resist composition with a capability of being developed using an alkaline solution, or in other words, with an alkaline development capability.

The carboxyl group-containing resin can contain a compound that has a carboxyl group and that is not photopolymerizable (hereinafter, referred to as (A1) component).

The (A1) component contains, for example, polymer of an ethylenically unsaturated monomer that contains an ethylenically unsaturated compound having a carboxyl group. Furthermore, the ethylenically unsaturated monomer may contain an ethylenically unsaturated compound that does not have a carboxyl group.

The ethylenically unsaturated compound having a carboxyl group can contain an appropriate polymer and prepolymer, and for example, can contain a compound that has only one ethylenically unsaturated group. More specifically, for example, the ethylenically unsaturated compound having a carboxyl group can contain at least one compound selected from the group consisting of acrylic acid, methacrylic acid, ω-carboxy-polycaprolactone (n≈2) monoacrylate, crotonic acid, cinnamic acid, 2-acryloyloxyethyl succinate, 2-methacryloyloxyethyl succinate, 2-acryloyloxyethyl phthalate, 2-methacryloyloxyethyl phthalate, 2-acryloyloxypropyl phthalate, 2-methacryloyloxypropyl phthalate, 2-acryloyloxyethyl maleate, 2-methacryloyloxyethyl maleate, 3-carboxyethyl acrylate, 2-acryloyloxyethyl tetrahydrophthalate, 2-methacryloyloxyethyl tetrahydrophthalate, 2-acryloyloxyethyl hexahydrophthalate, and 2-methacryloyloxyethyl hexahydrophthalate. The ethylenically unsaturated compound having a carboxyl group can also contain a compound having a plurality of ethylenically unsaturated groups. More specifically for example, the ethylenically unsaturated compound having a carboxyl group can contain a compound obtained by causing polyfunctional (meth)acrylate having a hydroxyl group selected from the group consisting of pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate to react with a dibasic acid anhydride. These compounds are used alone or in combination.

It is sufficient that the ethylenically unsaturated compound that does not have a carboxyl group is a compound that is able to be copolymerized with an ethylenically unsaturated compound having a carboxyl group. The ethylenically unsaturated compound that does not have a carboxyl group can contain a compound that has an aromatic ring and/or a compound that does not have an aromatic ring.

The compound that has an aromatic ring can contain at least one compound selected from the group consisting of 2-(meth)acryloyloxyethyl-2-hydroxyethyl phthalate, benzyl (meth)acrylate, neopentyl glycol benzoate (meth)acrylate, paracumylphenoxyethylene glycol (meth)acrylate. EO-modified cresol (meth)acrylate, ethoxylated phenyl (meth)acrylate, nonylphenoxy polyethylene glycol (meth) acrylate (n=2 to 17), ECH-modified phenoxy (meth)acrylate, phenoxy diethylene glycol (meth)acrylate, phenoxyethyl (meth)acrylate, phenoxy hexaethylene glycol (meth) acrylate, phenoxy tetraethylene glycol (meth)acrylate, tribromophenyl (meth)acrylate, EO-modified tribromophenyl (meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, N-phenylmaleimide, N-benzylmaleimide, N-vinylcarbazole, styrene, vinylnaphthalene, and 4-vinylbiphenyl, for example.

The compound that does not have an aromatic ring can contain at least one compound selected from the group consisting of linear or branched aliphatic or alicyclic (which may include a ring having an unsaturated bond) (meth) acrylic acid esters, hydroxyalkyl (meth)acrylates, and alkoxyalkyl (meth)acrylates, and N-substituted maleimides such as N-cyclohexylmaleimide, for example. The compound that does not have an aromatic ring may contain a compound having two or more ethylenically unsaturated groups in one molecule, such as polyethylene glycol di(meth)acrylate, polypropylene glycol di(meth)acrylate, trimethylolpropane tri(meth)acrylate, and pentaerythritol tri(meth) acrylate. These compounds are used alone or in combination. These compounds are preferable in that the hardness and oiliness of the solder resist layer are easily adjusted.

Types, ratios, and the like of a compound used to obtain the (A1) component are appropriately selected such that the acid value of the (A1) component has an appropriate value. The acid value of the (A1) component is preferably within a range of 20 to 180 mgKOH/g, and more preferably within a range of 35 to 165 mgKOH/g.

The carboxyl group-containing resin can also contain a photopolymerizable carboxyl group-containing resin (hereinafter, referred to as a (A2) component) having a carboxyl group and a photopolymerizable functional group. The photopolymerizable functional group is an ethylenically unsaturated group, for example.

The (A2) component can contain, for example, a resin (hereinafter, referred to as a first resin (a)) having a structure obtained by: at least one of epoxy groups in an epoxy compound (a1) having two or more epoxy groups in one molecule being reacted with an ethylenically unsaturated compound (a2) having a carboxyl group; and at least one compound (a3) selected from polyvalent carboxylic acids and anhydrides thereof being further added to the reaction product.

The epoxy compound (a1) can contain at least one compound selected from the group consisting of cresol novolac epoxy resins, phenol novolac epoxy resins, bisphenol A epoxy resins, bisphenol F epoxy resins, bisphenol A-novolac epoxy resins, naphthalene epoxy resins, biphenyl epoxy resins, biphenyl aralkyl epoxy resins, triglycidyl isocyanurate, and alicyclic epoxy resins, for example.

The epoxy compound (a1) may contain a polymer of an ethylenically unsaturated compound (p) containing a compound (p1) having an epoxy group. The ethylenically unsaturated compound (p) that is provided in the synthesis of this polymer may only contain the compound (p1) having an epoxy group, or may contain the compound (p1) having an epoxy group and a compound (p2) that does not have an epoxy group.

The compound (p1) having an epoxy group can contain a compound selected from appropriate polymers and prepolymers. Specifically, the compound (p1) having an epoxy group can contain at least one compound selected from the group consisting of epoxycyclohexyl derivatives of acrylic acid, epoxycyclohexyl derivatives of methacrylic acid, alicyclic epoxy derivatives of acrylate, alicyclic epoxy derivatives of methacrylate, β-methylglycidyl acrylate, and β-methylglycidyl methacrylate. In particular, it is preferable that the compound (p1) having an epoxy group contains glycidyl (meth)acrylate that is generally used and can be easily obtained.

It is sufficient that the compound (p2) that does not have an epoxy group is a compound that can copolymerize with the compound (p1) having an epoxy group. The compound (p2) that does not have an epoxy group can contain at least one compound selected from the group consisting of 2-(meth)acryloyloxyethyl phthalate, 2-(meth)acryloyloxyethyl-2-hydroxyethyl phthalate, 2-(meth)acryloyloxypropyl phthalate, benzyl (meth)acrylate, neopentyl glycol benzoate (meth)acrylate, paracumylphenoxyethylene glycol (meth)acrylate, EO-modified cresol (meth)acrylate, ethoxylated phenyl (meth)acrylate, nonylphenoxy polyethylene glycol (meth)acrylate (degree of polymerization n=2 to 17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth)acrylate. EO-modified bisphenol A di(meth)acrylate. PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, vinylcarbazole, styrene, N-phenylmaleimide, N-benzylmaleimide, 3-maleimide benzoic acid N-succinimidyl, linear or branched aliphatic or alicyclic (which may include a ring having an unsaturated bond) (meth)acrylic acid esters, hydroxyalkyl (meth)acrylate, alkoxyalkyl (meth)acrylate, and N-substituted maleimides (for example, N-cyclohexylmaleimide), for example.

The compound (p2) that does not have an epoxy group may contain a compound having two or more ethylenically unsaturated groups in one molecule. As a result of this compound being used and the amount thereof being adjusted, the hardness and oiliness of the solder resist layer is easily adjusted. The compound having two or more ethylenically unsaturated groups in one molecule can contain at least one compound selected from the group consisting of polyethylene glycol di(meth)acrylate, polypropylene glycol di(meth)acrylate, trimethylolpropane tri(meth)acrylate, and pentaerythritol tri(meth)acrylate, for example.

Polymers can be obtained by the ethylenically unsaturated compound (p) being polymerized by a known polymerization method such as a solution polymerization method or an emulsion polymerization method, for example. Specific examples of solution polymerization methods include a method in which the ethylenically unsaturated compound (p) is heated and stirred in an appropriate organic solvent with a polymerization initiator under a nitrogen atmosphere, and an azeotropic polymerization method.

An organic solvent used for polymerization of the ethylenically unsaturated compound (p) can contain at least one compound selected from the group consisting of ketones such as methylethyl ketone and cyclohexanone, aromatic hydrocarbons such as toluene and xylene, acetate esters such as ethyl acetate, butyl acetate, cellosolve acetate, butyl cellosolve acetate, carbitol acetate, butyl carbitol acetate, and propylene glycol monomethyl ether acetate, and dialkylglycol ethers, for example.

The polymerization initiator used for polymerization of the ethylenically unsaturated compound (p) can contain at least one compound selected from the group consisting of hydroperoxides such as diisopropyl benzene hydroperoxide, dialkyl peroxides such as dicumyl peroxide and 2,5-dimethyl-2,5-di-(t-butylperoxy)-hexane, diacyl peroxides such as isobutyryl peroxide, ketone peroxides such as methyl ethyl ketone peroxide, alkyl peresters such as t-butyl peroxypivalate, peroxydicarbonates such as diisopropyl peroxydicarbonate, azo compounds such as azobisisobutyronitrile, and redox-system initiators, for example.

The ethylenically unsaturated compound (a2) can contain a compound selected from the group consisting of appropriate polymers and prepolymers. The ethylenically unsaturated compound (a2) can contain a compound having only one ethylenically unsaturated group. The compound having only one ethylenically unsaturated group can contain at least one compound selected from the group consisting of acrylic acid, methacrylic acid, crotonic acid, cinnamic acid, 2-acryloyloxyethyl succinate, 2-methacryloyloxyethyl succinate, 2-acryloyloxyethyl phthalate, 2-methacryloyloxyethyl phthalate, β-carboxyethyl acrylate, 2-acryloyloxypropyl phthalate, 2-methacryloyloxypropyl phthalate, 2-acryloyloxyethyl maleate, 2-methacryloyloxyethyl maleate, 2-acryloyloxyethyl tetrahydrophthalate, 2-methacryloyloxyethyl tetrahydrophthalate, 2-acryloyloxyethyl hexahydrophthalate, and 2-methacryloyloxyethyl hexahydrophthalate, for example. The ethylenically unsaturated compound (a2) can contain a compound having a plurality of ethylenically unsaturated groups. The compound having the plurality of ethylenically unsaturated groups can contain at least one compound selected from the group consisting of compounds obtained by causing polyfunctional acrylates and polyfunctional methacrylates that have a hydroxyl group, such as pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate to react with a dibasic acid anhydride, for example.

In particular, it is preferable that the ethylenically unsaturated compound (a2) contains at least one of acrylic acid and methacrylic acid. In this case, the ethylenically unsaturated group derived from acrylic acid and methacrylic acid has excellent photoreactivity in particular, and thus the first resin (a) has high photoreactivity.

The usage amount of the ethylenically unsaturated compound (a2) is preferably within a range of 0.4 to 1.2 mol of the carboxyl group in the ethylenically unsaturated compound (a2) relative to 1 mol of the epoxy group in the epoxy compound (a1), and preferably particularly within a range of 0.5 to 1.1 mol of the carboxyl group relative to 1 mol of the epoxy group.

The compound (a3) selected from the group consisting of polyvalent carboxylic acids and anhydrides thereof can contain at least one compound selected from the group consisting of dicarboxylic acids such as phthalic acid, tetrahydrophthalic acid, methyltetrahydrophthalic acid, methylnadic acid, hexahydrophthalic acid, methyl hexahydrophthalic acid, succinic acid, methylsuccinic acid, maleic acid, citraconic acid, glutaric acid, and itaconic acid; polyvalent carboxylic acids of tribasic acids or greater polyvalent carboxylic acids such as cyclohexane-1,2,4-tricarboxylic acid, trimellitic acid, pyromellitic acid, benzophenone tetracarboxylic acid, and methylcyclohexene tetracarboxylic acid; and anhydrides of these polyvalent carboxylic acids.

The compound (a3) is used mainly for the purpose of giving an acid value to the first resin (a) so that the liquid solder resist composition re-disperses and re-dissolves in a dilute aqueous alkaline solution. The usage amount of the compound (a3) is adjusted such that the first resin (a) preferably has an acid value of 30 mgKOH/g or greater, and particularly preferably has an acid value of 60 mgKOH/g or greater. Also, the usage amount of the compound (a3) is adjusted such that the first resin (a) preferably has an acid value of 160 mgKOH/g or less, and particularly preferably 130 mgKOH/g or less.

When the first resin (a) is synthesized, a known method can be adopted to cause the addition reaction between the epoxy compound (a1) and the ethylenically unsaturated compound (a2) and the addition reaction between the product resulting from this addition reaction (addition reaction product) and the compound (a3) to progress. For example, at the time of the addition reaction between the epoxy compound (a1) and the ethylenically unsaturated compound (a2), the ethylenically unsaturated compound (a2) is added to the solvent solution of the epoxy compound (a1), and a thermal polymerization inhibitor and a catalyst are further added as needed, and then the mixture is stirred and mixed to obtain a reactive solution. As a result of causing the reaction of this reactive solution using a usual method at a reaction temperature of preferably 60 to 150° C. and particularly preferably 80 to 120° C., the addition reaction product can be obtained. Examples of the thermal polymerization inhibitor include hydroquinone and hydroquinone monomethyl ether. Examples of the catalyst include tertiary amines such as benzyldimethylamine and triethylamine, quaternary ammonium salts such as trimethylbezylammonium chloride and methyltriethylammonium chloride, triphenylphosphine, and triphenyl stibine.

When the addition reaction between the addition reaction product and the compound (a3) is caused to progress, the compound (a3) is added to the solvent solution containing the addition reaction product, a thermal polymerization inhibitor and a catalyst are further added as needed, and then the mixture is stirred and mixed to obtain a reactive solution. As a result of causing the reaction of the reactive solution using a usual method, the first resin (a) can be obtained. It is sufficient that reaction conditions are the same as those for the case of the addition reaction between the epoxy compound (a1) and the ethylenically unsaturated compound (a2). The compounds used at the time of the addition reaction between the epoxy compound (a1) and the ethylenically unsaturated compound (a2) having a carboxyl group can be used as is, as the thermal polymerization inhibitor and the catalyst.

The (A2) component may contain a carboxyl group-containing (meth)acryl-based copolymer resin (referred to as a second resin (b)) obtained by causing a portion of carboxyl groups in the polymer of an ethylenically unsaturated monomer containing an ethylenically unsaturated compound having a carboxyl group to react with an ethylenically unsaturated compound having an epoxy group. The ethylenically unsaturated monomer may also include an ethylenically unsaturated compound that does not have a carboxyl group as needed.

The ethylenically unsaturated compound having a carboxyl group for obtaining the second resin (b) can contain an appropriate polymer and/or prepolymer. For example, the ethylenically unsaturated compound having a carboxyl group can contain a compound having only one ethylenically unsaturated group. More specifically, the ethylenically unsaturated compound having a carboxyl group can contain at least one compound selected from the group consisting of acrylic acid, methacrylic acid, ω-carboxy-polycaprolactone (n≈2) monoacrylate, crotonic acid, cinnamic acid, 2-acryloyloxyethyl succinate, 2-methacryloyloxyethyl succinate, 2-acryloyloxyethyl phthalate, 2-methacryloyloxyethyl phthalate, β-carboxyethyl acrylate, 2-acryloyloxypropyl phthalate, 2-methacryloyloxypropyl phthalate, 2-acryloyloxyethyl maleate, 2-methacryloloxyethyl maleate, 2-acryloyloxyethyl tetrahydrophthalate, 2-methacryloyloxyethyl tetrahydrophthalate, 2-acryloyloxyethyl hexahydrophthalate, and 2-methacryloyloxyethyl hexahydrophthalate, for example. The ethylenically unsaturated compound having a carboxyl group can contain a compound having a plurality of ethylenically unsaturated groups. More specifically, for example, the ethylenically unsaturated compound having a carboxyl group can contain a compound obtained by causing polyfunctional (meth)acrylate having a hydroxyl group selected from the group consisting of pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate to react with a dibasic acid anhydride. These compounds are used alone or in combination.

It is sufficient that the ethylenically unsaturated compound that does not have a carboxyl group for obtaining the second resin (b) is a compound that can copolymerize with the ethylenically unsaturated compound having a carboxyl group. The ethylenically unsaturated compound that does not have a carboxyl group can contain a compound that has an aromatic ring and/or a compound that does not have an aromatic ring.

The compound that has an aromatic ring can contain at least one compound selected from the group consisting of 2-(meth)acryloyloxyethyl-2-hydroxyethyl phthalate, benzyl (meth)acrylate, neopentyl glycol benzoate (meth)acrylate, paracumylphenoxyethylene glycol (meth)acrylate, EO-modified cresol (meth)acrylate, ethoxylated phenyl (meth)acrylate, nonylphenoxy polyethylene glycol (meth)acrylate (n=2 to 17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth)acrylate, EO-modified bisphenol A di(meth)acrylate. PO-modified bisphenol A di(meth)acrylate, modified bisphenol A di(meth)acrylate. EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, N-phenylmaleimide, N-benzylmaleimide, N-vinylcarbazole, styrene, vinylnaphthalene, and 4-vinylbiphenyl, for example.

The compound that does not have an aromatic ring can contain at least one compound selected from the group consisting of linear or branched aliphatic or alicyclic (which may include a ring having an unsaturated bond) (meth)acrylic acid esters, hydroxyalkyl (meth)acrylates, and alkoxyalkyl (meth)acrylates, and N-substituted maleimides such as N-cyclohexylmaleimide, for example. The compound that does not have an aromatic ring may contain a compound having two or more ethylenically unsaturated groups in one molecule, such as polyethylene glycol di(meth)acrylate, polypropylene glycol di(meth)acrylate, trimethylolpropane tri(meth)acrylate, and pentaerythritol tri(meth)acrylate. These compounds are used alone or in combination. These compounds are preferable in that the hardness and oiliness of the solder resist layer are easily adjusted.

Examples of the ethylenically unsaturated compound having an epoxy group for obtaining the second resin (b) include appropriate polymers and prepolymers. Specific examples of the ethylenically unsaturated compound having an epoxy group include epoxycyclohexyl derivatives of acrylic acid or methacrylic acid; alicyclic epoxy derivatives of acrylate or methacrylate; β-methylglycidyl acrylate, and β-methylglycidyl methacrylate. These compounds are used alone or in combination. In particular, it is preferable to use glycidyl (meth)acrylate that is generally used and can be easily obtained.

The (A2) component may contain a resin (hereinafter, referred to as a third resin (c)) obtained by adding a compound having an ethylenically unsaturated group and an isocyanate group to a portion or all of hydroxyl groups in a polymer of an ethylenically unsaturated monomer that contains both an ethylenically unsaturated compound having a carboxyl group and an ethylenically unsaturated compound having a hydroxyl group. The ethylenically unsaturated monomer may contain an ethylenically unsaturated compound that does not have a carboxyl group nor hydroxyl group as needed.

Examples of the ethylenically unsaturated compound having a carboxyl group for obtaining the third resin (c) may be the same as those recited for the ethylenically unsaturated compound having a carboxyl group for obtaining the second resin (b) described above, for example.

Specific examples of the ethylenically unsaturated compound having a hydroxyl group for obtaining the third resin (c) include hydroxyalkyl (meth)acrylates such as 2-hydroxyethyl (meth)acrylate, 2-hydroxypropyl (meth)acrylate, 4-hydroxybutyl (meth)acrylate, cyclohexanedimethanol mono (meth)acrylate, 2-(meth)acryloyloxyethyl-2-hydroxyethylphtalate, caprolactone (meth)acrylate, polyethylene glycol (meth)acrylate, polypropylene glycol (meth)acrylate, trimethylolpropane di(meth)acrylate, pentaerythritol tri(meth)acrylate, dipentaerythritol penta(meth)acrylate; hydroxybutyl vinyl ether; hydroxyethyl vinyl ether; and N-hydroxyethyl (meth)acrylamide.

Specific examples of the compound having an ethylenically unsaturated group and an isocyanate group for obtaining the third resin (c) include 2-acryloyloxyethyl isocyanate (specific examples include part number "Karenz AOI" (Showa Denko K.K.)), 2-methacryloyloxyethyl isocyanate (specific examples include part number "Karenz MOI" (Showa Denko K.K.)), methacryloyloxyethoxyethyl isocyanate (specific examples include part number "Karenz MOIFEG" (Showa Denko K.K.)), an isocyanate block body of Karenz MOI (specific examples include part number "Karenz MOI-BM" (Showa Denko K.K.)), an isocyanate block body of Karenz MOI (specific examples include part number "Karenz MOI-BP" (Showa Denko K.K.), and 1,1-(bisacryloyloxymethyl)ethyl isocyanate) (specific examples include part number "Karenz BEI" (Showa Denko K.K.)).

It is preferable that the weight average molecular weight of the (A2) component as a whole is within a range of 800 to 100000. In this range, a liquid solder resist composition can achieve excellent photosensitivity and resolution.

The acid value of the (A2) component as a whole is preferably 30 mgKOH/g or greater, and in this case, the liquid solder resist composition can be easily developed. It is further preferable that this acid value is 60 mgKOH/g or greater. Also, the acid value of the (A2) component as a whole is preferably 180 mgKOH/g or less, and in this case, a residual amount of carboxyl groups in a covering film made of the liquid solder resist composition is reduced, and good electrical properties, electrical corrosion-resistance, water-resistance, and the like of the covering film are maintained. It is further preferable that the acid value is 150 mgKOH/g or less.

A photopolymerizable compound provides the liquid solder resist composition with photocurability. The photopolymerizable compound contains at least one compound selected from the group consisting of photopolymerizable monomers and photopolymerizable prepolymers.

The photopolymerizable monomer has an ethylenically unsaturated group, for example. The photopolymerizable monomer can contain at least one compound selected from the group consisting of monofunctional (meth)acrylates such as 2-hydroxyethyl (meth)acrylate; and polyfunctional (meth)acrylates such as diethylene glycol di(meth)acrylate, trimethylolpropane di(meth)acrylate, trimethylolpropane tri (meth)acrylate, pentaerythritol tri(meth)acrylate, pentaerythritol tetra(meth)acrylate, dipentaerythritol penta(meth)acrylate, dipentaerythritol hexa(meth)acrylate, and ε-caprolactone modified pentaerythritol hexaacrylate, for example.

It is also preferable that the photopolymerizable monomer contains a phosphorus-containing compound (phosphorus-containing photopolymerizable compound). In this case, a substance obtained by curing the liquid solder resist composition has improved flame retardance.

The phosphorus-containing photopolymerizable compound can contain at least one compound selected from the group consisting of 2-methacrylovloxyethylacid phosphate (specific examples include part number "light ester P-1M" and "light ester P-2M" available from Kyoeisha Chemical Co., LTD.), 2-acryloyloxyethylacid phosphate (specific examples include part number "light acrylate P-1A" available from Kyoeisha Chemical Co., LTD.), dipheyl-2-methacryloyloxyethyl phosphate (specific examples include part number "MR-260" available from Daihachi Chemical Co., LTD.), and HFA series available from Showa highpolymer Co., LTD. (specific examples include part number "HFA-6003" and "HFA-6007", which are products resulting from the addition reaction between dipentaerythritol hexaacrylate and HCA, part number "HFA-3003" and "HFA-6127", which are products resulting from the addition reaction between caprolactone modified dipentaerythritol hexaacrylate and HCA, and the like), for example.

Examples of photopolymerizable prepolymers include prepolymers obtained by adding an ethylenically unsaturated group to a prepolymer obtained by polymerization of a photopolymerizable monomer, oligo (meth)acrylate prepolymers such as epoxy (meth)acrylate, polyester (meth)acrylate, urethane (meth)acrylate, alkyd resin (meth)acrylate, silicone resin (meth)acrylate, and spirane resin (meth)acrylate.

In the present embodiment, the photopolymerization initiator contains bisacylphosphine oxide-based photopolymerization initiator, a first α-hydroxyalkyl phenone-based photopolymerization initiator, and a second α-hydroxyalkyl phenone-based photopolymerization initiator. The first α-hydroxyalkyl phenone-based photopolymerization initiator is a liquid at 25° C., and the second α-hydroxyalkyl phenone-based photopolymerization initiator is a solid at 25° C.

Thus, in the present embodiment, the solder resist layer obtained by curing a coating film made of a liquid solder resist composition using ultraviolet rays can be sufficiently cured entirely from its upper portion to its lower portion. The reason is considered to be as follows.

The bisacyiphosphine oxide-based photopolymerization initiator reacts using a component of comparatively long-wavelength ultraviolet rays. Such a component of comparatively long-wavelength is likely to reach the lower portion of the coating film made of the liquid solder resist composition. Therefore, the bisacylphosphine oxide-based photopolymerization initiator can improve the efficiency of a photo-curing reaction in the lower portion of the coating film.

On the other hand, the first α-hydroxyalkyl phenone-based photopolymerization initiator and the second α-hydroxyalkyl phenone-based photopolymerization initiator react using light having comparatively short-wavelength ultraviolet rays. Light having such comparatively short-wavelength ultraviolet rays is unlikely to reach the lower portion of the coating film. However, the reactions of the first α-hydroxyalkyl phenone-based photopolymerization initiator and the second α-hydroxyalkyl phenone-based photopolymerization initiator are unlikely to be interfered by oxygen, and therefore have high photoreactivity. Therefore, the first α-hydroxyalkyl phenone-based photopolymerization initiator and the second α-hydroxyalkyl phenone-based photopolymerization initiator can improve the efficiency of a photo-curing reaction in the upper portion of the coating film.

Furthermore, because a light wavelength region in which the first α-hydroxyalkyl phenone-based photopolymerization initiator undergoes a reaction is different from a light wavelength region in which the second α-hydroxyalkyl phenone-based photopolymerization initiator undergoes a reaction, ultraviolet rays can be efficiently used. Therefore, the photo-curing reaction further efficiently progresses in the upper portion of the coating film.

Accordingly, in the present embodiment, it is possible to allow the photo-curing reaction to efficiently progress entirely from the upper portion of the coating film to the lower portion thereof. Accordingly, it is conceivable that the upper portion of the solder resist layer can be sufficiently cured and the lower portion thereof can also be sufficiently cured.

If the solder resist layer is sufficiently cured entirely from its upper portion to its lower portion, the degree of hardness of the solder resist layer is unlikely to have variations, as a result of which wrinkles resulting from shrinkage during curing are unlikely to occur in the solder resist layer. Accordingly, the solder resist layer has an improved smoothness.

Also, if the solder resist layer is sufficiently cured from its upper portion to its lower portion, the solder resist layer has an improved homogeneity. Therefore, even though stress occurs due to the solder resist layer being deformed by heat in soldering process, reflowing process, and the like, the stress is easily distributed in the solder resist layer, as a result of which cracks are unlikely to occur in the solder resist layer.

Also, a bisacylphosphine oxide-based photopolymerization initiator is generally likely to be crystallized. If crystals of the bisacylphosphine oxide-based photopolymerization initiator are precipitated in the liquid solder resist composition, there are risks that as a result of the crystals rising to the surface of the coating film made of the liquid solder resist composition, uniformity of the surface of the solder resist layer is deteriorated, reliability of a printed-wiring board is extremely reduced, and it is difficult for the liquid solder resist composition to be uniformly cured using ultraviolet rays. However, in the present embodiment, the liquid solder resist composition contains the first α-hydroxyalkyl phenone-based photopolymerization initiator that is a liquid at 25° C., and thereby crystals of the bisacylphosphine oxide-based photopolymerization initiator are inhibited from being precipitated even though the liquid solder resist composition is stored for a long period of time. The liquid solder resist composition contains the second α-hydroxyalkyl phenone-based photopolymerization initiator that is a solid at 25° C., and thereby crystals of the bisacylphosphine oxide-based photopolymerization initiator are further inhibited from being precipitated. Accordingly, the liquid solder resist composition has an improved storage stability.

Also, if the photopolymerization initiator contains only the bisacylphosphine oxide-based photopolymerization initiator and the first α-hydroxyalkyl phenone-based photopolymerization initiator, the amount of the first α-hydroxyalkyl phenone-based photopolymerization initiator is increased, and thus the tackiness of a coating film (dried coating film) made of the liquid solder resist composition is increased. However, in the present embodiment, the photopolymerization initiator also contains the second α-hydroxyalkyl phenone-based photopolymerization initiator that is a solid at 25° C., and thereby the amount of the first α-hydroxyalkyl phenone-based photopolymerization initiator can be reduced, and the tackiness of the coating film can be reduced without losing a good storage stability of the liquid solder resist composition. Thus, the coating film can be easily handled, and even though a negative mask or the like is arranged on the coating film when the coating film is exposed to light, the negative mask or the like is unlikely to be attached to the coating film, as a result of which the workability is improved.

Also, the first α-hydroxyalkyl phenone-based photopolymerization initiator and the second α-hydroxyalkyl phenone-based photopolymerization initiator do not generate a benzyl radical at the time of a photo-curing reaction, and therefore the solder resist layer is unlikely to be colored. Furthermore, although the bisacylphosphine oxide-based photopolymerization initiator naturally has a color, bleaching occurs due to decomposition at the time of the photo-curing reaction, as a result of which the solder resist layer is unlikely to be colored. Thus, the solder resist layer is inhibited from turning yellow, whiteness of the solder resist layer is increased, and the good light reflectivity of the solder resist layer can be maintained.

The bisacylphosphine oxide-based photopolymerization initiator can contain at least one component selected from the group consisting of bis-(2,6-dichlorobenzoyl)phenylphosphine oxide, bis-(2,6-dichlorobenzoyl)-2,5-dimethylphenyl phosphine oxide, bis-(2,6-dichlorobenzoyl)-4-propylphenylphosphine oxide, bis-(2,6-dichlorobenzoyl)-1-naphthylphosphine oxide, bis-(2,6-dimethoxybenzoyl) phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, bis-(2,4,6-trimethylbenzoyl)phenylphosphine oxide, and (2,5,6-trimethylbenzoyl)-2,4,4-trimethylpentylphosphine oxide, for example.

In particular, the bisacylphosphine oxide-based photopolymerization initiator preferably contains bis-(2,4,6-trimethylbenzoyl)phenylphosphine oxide, and more preferably contains only bis-(2,4,6-trimethylbenzoyl)phenylphosphine oxide. In these cases, the solder resist layer is further inhibited from being colored.

The first α-hydroxyalkyl phenone-based photopolymerization initiator can contain at least one of α-hydroxyalkyl phenone and an alkyl ester of α-hydroxyalkyl phenone, for example. The melting point of the first α-hydroxyalkyl phenone-based photopolymerization initiator is particularly preferably within a range of −40 to 25° C., and further preferably within a range of 0 to 20° C. In particular, the first α-hydroxyalkyl phenone-based photopolymerization initiator preferably contains 2-hydroxy-2-methyl-1-phenyl-propane-1-one, and also preferably contains only 2-hydroxy-2-methyl-1-phenyl-propane-1-one. In these cases, the solder resist layer is further inhibited from being colored.

The second α-hydroxyalkyl phenone-based photopolymerization initiator can contain at least one of α-hydroxyalkyl phenone and an alkyl ester of α-hydroxyalkyl phenone, for example. The melting point of the second α-hydroxyalkyl phenone-based photopolymerization initiator is particularly preferably within a range of 25 to 200° C., and further preferably within a range of 40 to 1.00° C. The second α-hydroxyalkyl phenone-based photopolymerization initiator can contain at least one component selected from the group consisting of 1-hydroxycyclohexyl phenyl ketone, 1-[4-(2-hydroxyethoxy)-phenyl]-2-hydroxy-2-methyl-1-propane-1-one, and 2-hydroxy-1-{4-[4-(2-hydroxy-2-methyl-propionyl)-benzyl]phenyl}-2-methyl-propane-1-one. In particular, the second α-hydroxyalkyl phenone-based photopolymerization initiator preferably contains 1-hydroxycyclohexyl phenyl ketone, and also preferably contains only 1-hydroxycyclohexyl phenyl ketone. In these cases, the solder resist layer is further inhibited from being colored.

It is preferable that the mass ratio of the bisacylphosphine oxide-based photopolymerization initiator and the first α-hydroxyalkyl phenone-based photopolymerization initiator is within a range of 1:0.5 to 1:5. If the mass ratio of the first α-hydroxyalkyl phenone-based photopolymerization initiator relative to the bisacylphosphine oxide-based photopolymerization initiator is 0.5 or greater, the bisacylphosphine oxide-based photopolymerization initiator is particularly inhibited from being crystallized in the liquid solder resist composition, as a result of which the storage stability of the liquid solder resist composition is increased in particular. Also, if the mass ratio of the first α-hydroxyalkyl phenone-based photopolymerization initiator relative to the bisacylphosphine oxide-based photopolymerization initiator is 5 or less, the tackiness of the coating film (dried coating film) is reduced in particular. It is further preferable that the mass ratio is within a range of 1:1 to 1:4.

It is preferable that the mass ratio of the bisacylphosphine oxide-based photopolymerization initiator and the second α-hydroxyalkyl phenone-based photopolymerization initiator is within a range of 1:0.5 to 1:5. If the mass ratio of the second α-hydroxyalkyl phenone-based photopolymerization initiator relative to the bisacylphosphine oxide-based photopolymerization initiator is 0.5 or greater, dissolution of the bisacylphosphine oxide-based photopolymerization initiator in the liquid solder resist composition is particularly facilitated, as a result of which the storage stability of the liquid solder resist composition is increased in particular. Also, if the mass ratio of the second α-hydroxyalkyl phenone-based photopolymerization initiator relative to the bisacyiphosphine oxide-based photopolymerization initiator is 5 or less, the lower portion of the solder resist layer has increased curability. It is further preferable that the mass ratio is within a range of 1:1 to 1:4.

The liquid solder resist composition may further contain a known photopolymerization accelerating agent, a sensitizer, and the like. For example, the liquid solder resist composition may contain p-dimethylbenzoic acid ethyl ester, p-dimethylaminobenzoic acid isoamyl ester, 2-dimethylaminoethyl benzoate, and the like.

It is preferable that the photopolymerization initiator contains only the bisacylphosphine oxide-based photopolymerization initiator, the first α-hydroxyalkyl phenone-based photopolymerization initiator, and the second α-hydroxyalkyl phenone-based photopolymerization initiator. However, the photopolymerization initiator can also contain a component other than three types of the components described above without departing from the gist of the present invention. For example, in addition to the three types of the components described above, the photopolymerization initiator may contain at least one component selected from the group consisting of benzoin and alkyl ethers thereof, acetophenones such as acetophenone and benzyl dimethyl ketal; anthraquinones such as 2-methylanthraquinone; thioxanthones such as 2,4-dimethylthioxanthone, 2,4-diethylthioxanthone, 2-isopropylthioxanthone, 4-isopropylthioxanthone, and 2,4-diisopropylthioxanthone; benzophenones such as benzophenone and 4-benzoyl-4'-methyldiphenyl sulfide; xanthones such as 2,4-diisopropyl xanthone; compounds containing a nitrogen atom, such as 2-methyl-1-[4-(methylthio)phenyl]-2-morpholino-1-propanone; monoacylphosphine oxide-based photopolymerization initiators such as 2,4,6-trimethylbenzoyl-diphenyl-phosphine oxide (DAROCUR TPO) and 2,4,6-trimethylbenzoyl-ethyl-phenyl-phosphinate (SPEEDCURE TPO-L); 1,2-octane-dione, 1-[4-(phenylthio)-2-(O-benzoyloxime)] (IRGACURE OXE 01), ethanone and 1-[9-ethyl-6-(2-methylbenzoyl)-9H-carbazole-3-yl]-1-(O-acetyl oxime) (IRGACURE OXE 02).

Titanium dioxide turns the solder resist layer made of the liquid solder resist composition into white, as a result of which it provides the solder resist layer with a high light reflectivity. Titanium dioxide can contain one or both of a rutile titanium dioxide and an anatase titanium dioxide. In particular, it is preferable that titanium dioxide contains a rutile titanium dioxide. The rutile titanium dioxide is industrially produced by a chlorine method or a sulfuric acid method. In the present embodiment, the rutile titanium dioxide can contain one or both of a rutile titanium dioxide manufactured by the chlorine method and a rutile titanium dioxide manufactured by the sulfuric acid method.

The liquid solder resist composition may contain a thermosetting component. The liquid solder resist composition can be made into a thermoset by the thermosetting component.

It is preferable that the thermosetting component contains a compound having a cyclic ether skeleton. It is particularly preferable that the compound having a cyclic ether skeleton contains an epoxy compound.

It is preferable that the epoxy compound has at least two epoxy groups in one molecule. The epoxy compound may be a solvent-insoluble epoxy compound, or a general solvent-soluble epoxy compound. There is no particular limitation on the types of epoxy compounds, and in particular, it is preferable that the epoxy compound contains at least one component selected from the group consisting of phenol novolac epoxy resins (specific examples include part number "EPICLON N-775" available from DIC Corporation), cresol novolac epoxy resins (specific examples include part number "EPICLON N-695" available from DIC Corporation), bisphenol A epoxy resin (specific examples include part number "jER1001" available from Mitsubishi Chemical Corporation), bisphenol A-novolac epoxy resins (specific examples include part number "EPICLON N-865" available from DIC Corporation), bisphenol F epoxy resins (specific examples include part number "jER4004P" available from Mitsubishi Chemical Corporation), bisphenol S epoxy resins (specific examples include part number "EPICLON EXA-1514" available from DIC Corporation), bisphenol AD epoxy resins, biphenyl epoxy resins (specific examples include part number "YX4000" available from Mitsubishi Chemical Corporation), biphenyl novolac epoxy resins (specific examples include part number "NC-3000" available from Nippon Kayaku Co., Ltd.), hydrogenated bisphenol A epoxy resins (specific examples include part number "ST- 4000D" available from Nippon Steel & Sumikin Chemical Co., Ltd.), naphthalene epoxy resins (specific examples include part number "EPICLON HP-4032", "EPICLON HP-4700", and "EPICLON HP-4770" available from DIC Corporation), hydroquinone-type epoxy resins (specific examples include part number "YDC-1312" available from Nippon Steel & Sumikin Chemical Co., Ltd.), tertiary butyl-catechol-type epoxy resins (specific examples include part number "EPICLON HP-820" available from DIC Corporation), dicyclopentadiene type epoxy resins (specific examples include part number "EPICLON HP-7200" available from DIC Corporation), adamantane-type epoxy resins (specific examples include part number "ADAMANTATE X-E-201" available from Idemitsu Kosan Co., Ltd.), diphenyl ether type epoxy resins (specific examples include part number "YSLV-80DE" available from Nippon Steel & Sumikin Chemical Co., Ltd.), unique bifunctional epoxy resins (specific examples include part number "YL7175-500" and "YL7175-1000" available from Mitsubishi Chemical Corporation; part number "EPICLON TSR-960", "EPICLON TER-601", "EPICLON TSR-250-80BX", "EPICLON 1650-75MPX". "EPICLON EXA-4850", "EPICLON EXA-4816", "EPICLON EXA-4822", and "EPICLON EXA-9726" available from DIC Corporation; part number "YSLV-120TE" available from Nippon Steel & Sumikin Chemical Co., Ltd.), and bisphenol-based epoxy resins other than the epoxy resins described above.

It is also preferable that the epoxy compound contains triglycidyl isocyanurate. As triglycidyl isocyanurate, a β form having three epoxy groups oriented in the same direction relative to a plane of an S-triazine ring skeleton is particularly preferable, and alternatively, a mixture of this β form and an α form that has a structure in which one epoxy group is oriented, relative to a plane of the S-triazine ring skeleton, in a different direction from the direction in which the other two epoxy groups are oriented relative to the plane thereof is preferable.

It is also preferable that the epoxy compound contains a phosphorus-containing epoxy resin. In this case, a substance obtained by curing the liquid solder resist composition has an improved incombustibility. Examples of the phosphorus-containing epoxy resins include a phosphoric acid modified bisphenol F epoxy resin (specific examples include part number "EPICRON EXA-9726" and "EPICLON EXA-9710" available from DIC Corporation) and part number "epotohto FX-305" available from Nippon Steel & Sumikin Chemical Co., Ltd.

The liquid solder resist composition may contain an organic solvent. The organic solvent is used for liquefying or varnishing the liquid solder resist composition, and adjusting the viscosity, application properties, and film formation properties of the liquid solder resist composition, and the like.

The organic solvent can contain at least one compound selected from the group consisting of linear, branched, secondary, or polyhydric alcohols such as ethanol, propyl alcohol, isopropyl alcohol, hexanol, and ethylene glycol; ketones such as methyl ethyl ketone and cyclohexanone; aromatic hydrocarbons such as toluene and xylene; petroleum-based aromatic mixed solvent such as Swazole series (available from Maruzen Petrochemical Co., Ltd.), Solvesso series (available from Exxon Chemical Co.); cellosolves such as cellosolve and butyl cellosolve; carbitols such as carbitol and butyl carbitol; propylene glycol alkyl ethers such as propylene glycol methyl ether; polypropylene glycol alkyl ethers such as dipropylene glycol methyl ether; acetic esters such as ethyl acetate, butyl acetate, cellosolve acetate, and carbitol acetate; and dialkyl glycol ethers, for example.

It is preferable that the ratio of the organic solvent in the liquid solder resist composition is adjusted such that the organic solvent is quickly volatilized when a coating film made of the liquid solder resist composition is dried, or in other words, such that the dried film does not contain the organic solvent. In particular, the organic solvent is preferably within a range of 0 to 99.5% by mass relative to the liquid solder resist composition as a whole, and further preferably within a range of 15 to 60% by mass. It should be noted that it is preferable that the ratio is appropriately adjusted in accordance with an application method because a preferred ratio of the organic solvent is different in accordance with an application method, or the like.

The liquid solder resist composition may further contain a component other than the above-described components without departing from the gist of the present invention.

For example, the liquid solder resist composition may contain at least one resin selected from the group consisting of tolylene diisocyanate-based, morpholine diisocyanate-based, isophorone diisocyanate-based, and hexamethylene diisocyanate-based blocked isocyanates that are blocked with caprolactam, oximes, malonic esters, or the like; amino resins such as melamine resins, n-butylated melamine resins, isobutylated melamine resins, butylated urea resins, butylated melamine-urea co-condensation resins, and benzoguanamine-based co-condensation resins; various types of thermosetting resins other than the above-described resins; ultraviolet-curable epoxy (meth)acrylate; resins obtained by adding (meth)acrylic acid to an epoxy resin such as bisphenol A, phenol novolac, cresol novolac, alicyclic or the like resin; and macromolecular compounds such as diallyl phthalate resins, phenoxy resins, urethane resins, and fluororesins.

In the case where the liquid solder resist composition contains an epoxy compound, the liquid solder resist composition may further contain a curing agent for curing the epoxy compound. The curing agent can contain at least one component selected from the group consisting of imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid hydrazide and sebacic acid hydrazide; phosphorus compounds such as triphenylphosphine; acid anhydrides; phenol; mercaptan; Lewis acid amine complexes; and onium salts, for example. Examples of commercial products of these components include 2MZ-A, 2MZ-OK, 2PHZ, 2P4BHZ, and 2P4MHZ (they are product names of imidazole-based compounds) available from Shikoku Chemicals Corporation, U-CAT3503N and U-CAT3502T (they are product names of blocked isocyanate compounds of dimethylamine), and DBU, DBN, U-CATSA102, and U-CAT5002 (they are bicyclic amidine compounds and salts thereof) available from San-Apro Ltd.

The liquid solder resist composition may contain an adhesion imparting agent. Examples of the adhesion imparting agent include guanamine, acetoguanamine, benzoguanamine, melamine, and S-triazine derivatives such as 2,4-diamino-6-methacryloyloxyethyl-S-triazine, 2-vinyl-4,6-diamino-S-triazine, 2-vinyl-4,6-diamino-S-triazine/isocyanuric acid adducts, and 2,4-diamino-6-methacryloyloxyethyl-S-triazine/isocyanuric acid adducts.

The liquid solder resist composition may contain at least one component selected from the group consisting of hardeners; coloring agents other than white color; copolymers such as silicone and acrylates; leveling agents; adhesion imparting agents such as silane coupling agents; thixotropy agents; polymerization inhibitors; antihalation agents; flame retardants; antifoaming agents; antioxidants; surfactants; macromolecule dispersants; and inorganic fillers such as barium sulfate, crystalline silica, nanosilica, carbon nanotubes, talc, bentonite, aluminum hydroxide, and magnesium hydroxide.

Respective amounts of the components of the liquid solder resist composition are appropriately adjusted such that the liquid solder resist composition has photocurability and can be developed using an alkaline solution.

The percentage of the carboxyl group-containing resin is preferably within a range of 5 to 85% by mass relative to the solid component amount of the liquid solder resist composition, more preferably within a range of 10 to 75% by mass, and further preferably within a range of 10 to 40% by mass.

The percentage of the photopolymerizable compound is preferably within a range of 1 to 45% by mass relative to the solid component amount of the liquid solder resist composition, more preferably within a range of 2 to 40% by mass, and further preferably within a range of 5 to 30% by mass.

Also, in the case where the liquid solder resist composition contains a thermosetting component, the percentage of the thermosetting component is preferably within a range of 1.5 to 85% by mass relative to the solid component amount of the liquid solder resist composition, more preferably within a range of 1.5 to 60% by mass, and further preferably within a range of 2 to 40% by mass.

The percentage of the photopolymerization initiator is preferably within a range of 0.1 to 30% by mass relative to the solid component amount of the liquid solder resist composition, and further preferably within a range of 1 to 28% by mass.

It is preferable that titanium dioxide is within a range of 15 to 500 parts by mass relative to 100 parts by mass of the carboxyl group-containing resin in the liquid solder resist composition. Also, the titanium dioxide is preferably within a range of 3 to 220% by mass relative to the resin component amount of the liquid solder resist composition, and further preferably within a range of 10 to 180% by mass.

It should be noted that the solid component amount refers to the total amount of all components from which components of solvents and the like that volatilize in the process for forming the solder resist layer from the liquid solder resist composition are removed. Also, the resin component amount refers to the total amount of the carboxyl group-containing resin, the photopolymerizable compound, and the thermosetting component in the liquid solder resist composition.

Raw materials for the liquid solder resist composition described above can be mixed and kneaded by a known kneading method using, for example, a three roll mill, a ball mill, or a sand mill to prepare the liquid solder resist composition.

Taking storage stability and the like into consideration, a portion of raw materials for the liquid solder resist composition may be mixed to prepare a first agent, and then a remaining portion of the raw materials may be mixed to prepare a second agent. In other words, the liquid solder resist composition may contain the first agent and the second agent. For example, the photopolymerizable compound, the thermosetting component and a portion of the organic solvent, of the raw materials, may be mixed and dispersed in advance to prepare the first agent. Also, the remaining portion of the raw materials may be mixed and dispersed to prepare the second agent. In this case, an appropriate required amount of the first and second agents are mixed at an appropriate time to prepare a liquid mixture, and then the solder resist layer can be formed using this liquid mixture.

The liquid solder resist composition according to the present embodiment is applied for forming the solder resist layer on a printed-wiring board, for example.

Hereinafter, an example of methods for forming the solder resist layer on a printed-wiring board using the liquid solder resist composition according to the present embodiment will be described. In this example, the solder resist layer is formed using a photocurable and thermosetting liquid solder resist composition.

First, a printed-wiring board is prepared, and the liquid solder resist composition is used to form a coating film on the printed-wiring board. For example, the liquid solder resist composition is applied onto the surface of the printed-wiring board to form a wet-state coating film (wet coating film). A method for applying the liquid solder resist composition can be selected from the group consisting of known methods, for example, dipping, spraying, spin coating, roll coating, curtain coating, and screen printing methods. Thereafter, in order to volatilize the organic solvent in the liquid solder resist composition as needed, the wet coating film is dried under a temperature within a range of 60 to 120° C., for example, to obtain a post-dried coating film (dried coating film). In the present embodiment, as a result of the photopolymerization initiator containing three types of components as described above, the tackiness of the dried coating film is suppressed.

It should be noted that when the coating film is formed on the printed-wiring board, it is possible to adopt the following method (dried film method) that: the liquid solder resist composition is applied onto an appropriate support body and then dried to obtain the dried coating film in advance; this dried coating film is placed on the printed-wiring board; and then pressure is applied to the dried coating film and the printed-wiring board to provide the dried coating film on the printed-wiring board.

Thereafter, a negative mask is directly or indirectly applied to the dried coating film on the printed-wiring board, and then the negative mask is irradiated with active energy rays, as a result of which the coating film is exposed to light via the negative mask. The negative mask includes an exposure portion that allows the active energy rays to pass through and a non-exposure portion that blocks the active energy rays, and the exposure portion has a shape that matches the pattern of the solder resist layer. A photo tool such as a mask film or a dry plate is used as the negative mask. The active energy rays are selected in accordance with the composition of the liquid solder resist composition, and in the present embodiment, ultraviolet rays are used. The light source for the ultraviolet rays is selected from the group consisting of a chemical lamp, a low pressure mercury lamp, a medium pressure mercury lamp, a high pressure mercury lamp, an ultrahigh pressure mercury lamp, a xenon lamp, and a metal halide lamp.

It should be noted that a method other than the method using the negative mask may be adopted as an exposure method. For example, a direct drawing method by means of laser exposure or the like may be adopted.

In the present embodiment, if the dried coating film is exposed to ultraviolet rays in this manner, as described above, a photo-curing reaction efficiently progresses entirely from the upper portion of the dried coating film to the lower portion thereof.

After the dried coating film is exposed to light, the negative mask is removed from the printed-wiring board, and then a development treatment is performed on the dried coating film to remove a portion of the dried coating film that is not exposed to light. As a result, the portion of the dried coating film that was exposed to light remains on a first surface and a second surface of the printed-wiring board as the solder resist layer.

In the development treatment, an appropriate developer can be used in accordance with the composition of the liquid solder resist composition. Specific examples of developers include alkaline solutions such as an aqueous sodium carbonate solution, aqueous potassium carbonate solution, aqueous ammonium carbonate solution, aqueous sodium bicarbonate solution, aqueous potassium bicarbonate solution, aqueous ammonium bicarbonate solution, aqueous sodium hydroxide solution, aqueous potassium hydroxide solution, aqueous ammonium hydroxide solution, aqueous tetramethyl ammonium hydroxide solution, and aqueous lithium hydroxide solution. Organic amines such as monoethanolamine, diethanolamine, triethanolamine, monoisopropanolamine, diisopropanolamine, and triisopropanolamine can also be used as the developer. These developers can be used alone or in combination. In the case where the developer is an alkaline solution, the solvent thereof may be only water, or a mixture of water and a hydrophilic organic solvent such as lower alcohols.

In the case where the liquid solder resist composition contains a thermosetting component, the solder resist layer may be heat-cured by performing a heat treatment on the solder resist layer as needed. The conditions for the heat treatment are within a range of a heating temperature of 120 to 180° C. and within a range of a heating time of 30 to 90 minutes, for example. Accordingly, the performance of the solder resist layer, such as the strength, hardness, and chemical resistance, is improved.

Also, after the heat treatment was performed on the solder resist layer, the solder resist layer may be further irradiated with ultraviolet rays as needed. In this case, it is possible to further advance the photo-curing reaction in the solder resist layer. Accordingly, the migration resistance of the solder resist layer is further improved.

As described above, a covered-printed wiring board that includes the printed-wiring board and the solder resist layer that partially covers the printed-wiring board can be obtained. In the present embodiment, the solder resist layer is sufficiently cured entirely from its upper portion to its lower portion.

EXAMPLE

Hereinafter, an example of the present invention will be described. However, the present invention is not limited to the example described below.

Preparation of Carboxyl Group-containing Resin Solution (1) Carboxyl Group-containing Resin Solution A 60 parts by mass of methacrylic acid, 50 parts by mass of ω-carboxy-polycaprolactone (n≈2) monoacrylate (ARONIX M-5300 available from Toagosei Co., LTD.), 80 parts by mass of methyl methacrylate, 10 parts by mass of styrene, 430 parts by mass of dipropylene glycol monomethyl ether, and 5 parts by mass of azobisisobutyronitrile are placed in a four-neck flask into which a reflux condenser, a thermometer, a glass tube for nitrogen substitution, and a stirrer are inserted. The liquid in this four-neck flask is heated at 75° C. for 5 hours under nitrogen gas stream to advance a polymerization reaction, as a result of which a copolymer solution having a concentration of 32% was obtained.

0.1 parts by mass of hydroquinone, 64 parts by mass of glycidylmethacrylate, and 0.8 parts by mass of dimethylbenzylamine were added to this copolymer solution, and the mixture was heated at 80° C. for 24 hours to advance an addition reaction. Accordingly, a 38% solution of a compound having a carboxyl group and an ethylenically unsaturated group was obtained. The acid value of solid content in this solution was 92 mgKOH/g. This solution was used as a carboxyl group-containing resin solution A.

(2) Carboxyl Group-containing Resin Solution B 42 parts by mass of methacrylic acid, 98 parts by mass of methyl methacrylate, 40 parts of styrene, 20 parts of butyl methacrylate, 320 parts by mass of dipropylene glycol monomethyl ether, and 5 parts by mass of azobisisobutyronitrile are placed in a four-neck flask into which a reflux condenser, a thermometer, a glass tube for nitrogen substitution, and a stirrer are inserted. The liquid in this four-neck flask is heated at 75° C. for 5 hours under nitrogen gas stream to advance a polymerization reaction, as a result of which a copolymer solution having a concentration of 38% was obtained. The acid value of solid content in this solution was 137 mgKOH/g. This solution was used as a carboxyl group-containing resin solution B.

(3) Carboxyl Group-containing Resin Solution C

Acid-modified epoxy acrylate solution (Ripoxy PR-300CP, concentration 65% available from Showa Denko K.K.) was prepared, and this solution was used as a carboxyl group-containing resin solution C.

Preparation of Liquid Solder Resist Compositions

Liquid solder resist compositions were each obtained by mixing components in accordance with an item in Tables below and kneaded using a three roll mill. It should be noted that the details of the components shown in Table are as follows.

Photopolymerization initiator (IRGACURE819); bis(2,4,6-trimethylbezoyl)-phenylphosphin oxide, available from BASF SE, part number "IRGACURE819".

Photopolymerization initiator (DAROCUR1173); 2-hydroxy-2-methyl-1-phenyl-propane-1-one, available from BASF SE, part number "DAROCUR 1173".

Photopolymerization initiator (DAROCUR MBF); (1,2-dioxo-2-methoxyethyl) benzene, available from BASF SE, part number "DAROCUR MBF".

Photopolymerization initiator (IRGACURE184); 1-hydroxy-cyclohexyl-phenyl-ketone, available from BASF SE, part number "IRGACURE184".

Photopolymerization initiator (DAROCUR TPO); 2,4,6-trimethylbenzoyl-diphenyl-phosphine oxide, available from BASF SE, part number "DAROCUR TPO".

Rutile titanium dioxide CR-90; a rutile titanium dioxide manufactured by the chlorine method, available from Ishihara Sangyo Kaisha, LTD, part number "CR-90".

Rutile titanium dioxide R-79; a rutile titanium dioxide manufactured by the sulfuric acid method, available from Sakai Chemical Industry Co., Ltd., part number "R-79".

Epoxy compound; triglycidyl isocyanurate, available from Nissan Chemical Industries, Ltd., part number "TEPIC-SP".

Organic solvent; Methyl Propylene Di Glycol, available from Nippon Nyukazai Co., Ltd., part number "MFDG"

Photopolymerizable monomer DPHA; dipentaerythritol hexaacrylate.

Photopolymerizable momoner TMPTA; trimethylolpropane triacrylate.

Antifoaming agent; available from Shin-Etsu Chemical Co., Ltd., part number "KS-66".

Melamine; available from Nissan Chemical Industries. Ltd., fine powder melamine.

Evaluation Test (1) Production of Test Pieces

A glass epoxy copper clad laminate that includes a copper foil having a thickness of 35 μm was prepared. Etching was performed on this glass epoxy copper clad laminate to form conductive wiring, as a result of which a printed-wiring board was obtained. A resin composition for solder resist was applied to the entire surface of the printed-wiring board by screen printing, as a result of which a coating film was formed. This coating film was heated at 80° C. for 20 minutes to be dried. The thickness of a coating film obtained after drying the coating film (dried coating film) was 20 μm. While a negative mask was directly applied to the surface of the dried coating film, the negative mask was irradiated with ultraviolet rays so that the dried coating film was selectively exposed to light under the condition of an exposure energy of 450 mJ/cm$^2$. Subsequently, after the negative mask was removed from the dried coating film, the development treatment was performed on the dried coating film using an aqueous sodium carbonate solution, as a result of which a portion of the dried coating film that was cured by light exposure was left on the printed-wiring board as a solder resist layer. This solder resist layer was further heated at 150° C. for 60 minutes to be cured by heat. According to such procedures, test pieces that each included the solder resist layer were obtained.

The following evaluation tests were performed on the test pieces.

(2) Tackiness Evaluation

During the production of each test piece, when the negative mask was removed from the dried coating film after light exposure, the degree of peeling resistance between the dried coating film and the negative mask, and the state of the dried coating film after removal of the negative mask was checked. The results were evaluated as follows.

A: when the dried coating film before light exposure was touched by a finger, stickiness was not felt, and the dried coating film after removal of the negative mask after light exposure did not exhibit a mark of the negative mask.

B: when the dried coating film before light exposure was touched by a finger, slight stickiness was felt, and the dried coating film after removal of the negative mask after light exposure exhibited a mark of the negative mask.

C: when the dried coating film before light exposure was touched by a finger, significant stickiness was felt, and the dried coating film was damaged when the negative mask was removed therefrom after light exposure.

(3) Lower Portion Curability Evaluation (Dam Remaining Evaluation)

Regarding each liquid solder resist composition, a printed-wiring board including copper conductive wiring having a line width/space of 0.2 mm/0.3 mm and a thickness of 40 μm was prepared. Also, a negative mask having a mask pattern for forming solder dams having widths of 50 μm, 75 μm, 100 μm, and 125 μm was used. Solder dams having a thickness of 40 μm were formed on the printed-wiring board under the same condition as that for the case where the test piece was produced except that this printed-wiring board and this negative mask were used.

A cellophane adhesive tape peeling test was performed on the solder dams on each printed-wiring board to examine the minimum width of a remaining solder dam that did not peel off the printed-wiring board. An evaluation can be made that as the minimum width is smaller, the degree of curability of the lower portion of the solder dam is higher.

(4) Smoothness Evaluation

The external appearance of the solder resist layer of each test piece was visually observed. The results were evaluated as follows.

Good: there is no unevenness on the surface of the solder resist layer, and the surface is uniform.

Poor: there is unevenness on the surface of the solder resist layer, and the surface has wrinkles.

(5) Crack Resistance Evaluation

Regarding each liquid solder resist composition, a printed-wiring board including copper conductive wiring having a thickness of 40 μm was prepared. A solder resist layer was formed on the printed-wiring board under the same condition as that for the case of the above-described test piece. After the solder resist layer was heated under the condition of 250° C. for 2 minutes, the external appearance of the solder resist layer was visually observed. The results were evaluated as follows.

A: the solder resist layer did not have cracks.

B: there were some cracks near the boundary between the conductive wiring and the solder resist layer.

C: the solder resist layer had clear cracks.

(6) Storage Stability

The liquid solder resist compositions were stored in a refrigerator at 8° C. for three weeks. Thereafter, each liquid solder resist composition was applied to a smooth glass using an applicator to produce a coating film having a thickness of 10 μm. This coating film was visually observed. The results were evaluated as follows.

A: the surface of the coating film did not have minute particles.

B: the surface of the coating film had some minute particles.

C: the surface of the coating film had many minute particles.

(7) Photosensitivity Evaluation (Remaining Steps)

A test mask for light exposure (step tablet PHOTEC 21-step available from Hitachi Chemical Co., Ltd.) was directly applied to the dried coating film made of a liquid solder resist composition in each example and comparative example, and the pressure was reduced so that the coating film came into close contact with the test mask. Thereafter, the dried coating film was irradiated with ultraviolet rays via the test mask for light exposure under the condition of an exposure energy density of 3450 mJ/cm$^2$, using a low pressure adhesive type double-sided exposure machine (model number "ORC HMW680GW") available from ORC MANUFACTURING CO., LTD. Subsequently, a developer (aqueous sodium carbonate solution having a concentration of 1% by mass) was used to develop the dried coating film. The number of remaining steps at that time was used to evaluate the photosensitivity of the dried coating film.

(8) Heat Yellowing Resistance Evaluation b* value in an L*a*b* colorimetric system of the solder resist layer of each test piece immediately after the production was measured using a spectrophotometer (model number "CM-600d") available from Konica Minolta Sensing, Inc. Thereafter, after the test piece was heated under the condition of 250° C. for 5 minutes, b* value of the solder resist layer was again measured. A value (Δb*) obtained by subtracting the b* value of the solder resist layer before the heat treatment from the b* value of the solder resist layer after the heat treatment was calculated. The results were evaluated as follows.

A: Δb* value is 1.4 or less.

B: Δb* value is 1.5 to 1.9.

C: Δb* value is 2.0 to 2.4.

D: Δb* value is 2.5 or greater.

(9) Alkali-resistance Evaluation

The test pieces were immersed in a 10% aqueous sodium hydroxide solution at room temperature for 1 hour, and pulled out. Thereafter, a peeling test was performed on the solder resist layer of each test piece using cellophane adhesive tape. The state of the solder resist layer after the test was visually observed to check whether the solder resist layer had a change such as peeling, discoloration, and the like. The results were evaluated as follows.
A: there was no change in the external appearance.
B: there was a very slight change in the external appearance.
C: there was a slight change in the external appearance.
D: there was a significant change in the external appearance.

(10) Adhesion Evaluation

In accordance with a test method of JIS D0202, a cross-cut was made into the solder resist layer of each test piece, and then the peeled state after a peeling test using the cellophane adhesive tape was visually observed. The results were evaluated as follows.
A: there was no change in all of the 100 cross-cut portions.
B: there was a slight raise in one portion among the 100 cross-cut portions.
C: there was peeling from 2 to 10 portions among the 100 cross-cut portions.
D: there was peeling from 11 to 100 portions among the 100 cross-cut portions.

(11) Pencil Hardness

The pencil hardness of the solder resist layer of each test piece was measured using a Mitsubishi Hi-uni pencil (available from Mitsubishi Pencil Co., Ltd.) in accordance with JIS K5400.

TABLE 1

| | | Examples | | | | | | | |
|---|---|---|---|---|---|---|---|---|---|
| | | 1 | 2 | 3 | 4 | 5 | 6 | 7 | 8 |
| Composition/ parts by mass | carboxyl group-containing resin A | 80 | 80 | 80 | 80 | 80 | 80 | 80 | 80 |
| | carboxyl group-containing resin B | 0 | 0 | 0 | 0 | 0 | 0 | 0 | 0 |
| | carboxyl group-containing resin C | 0 | 0 | 0 | 0 | 0 | 0 | 0 | 0 |
| | photopolymerization initiator (IRGACURE819) | 3 | 3.5 | 4 | 4 | 4 | 5 | 5 | 5 |
| | photopolymerization initiator (DAROCUR1173) | 8 | 6 | 10 | 10 | 10 | 12 | 12 | 12 |
| | photopolymerization initiator (DAROCUR MBF) | 0 | 0 | 0 | 0 | 0 | 0 | 0 | 0 |
| | photopolymermerization initiator (IRGACURE184) | 8 | 7 | 6 | 6 | 6 | 5 | 5 | 5 |
| | photopolymerization initiator (DAROCUR TPO) | 0 | 0 | 0 | 0 | 0 | 0 | 0 | 0 |
| | rutile titanium dioxide CR-90 | 80 | 80 | 80 | 0 | 0 | 80 | 15 | 80 |
| | rutile titanium dioxide R-79 | 0 | 0 | 0 | 80 | 80 | 0 | 65 | 0 |
| | epoxy compound TEPIC-SP | 7 | 7 | 7 | 7 | 15 | 7 | 7 | 15 |
| | organic solvent | 5 | 5 | 5 | 5 | 10 | 5 | 5 | 10 |
| | photopolymerizable monomer DPHA | 20 | 20 | 20 | 20 | 15 | 15 | 15 | 15 |
| | photopolymerizable monomer TMPTA | 0 | 0 | 0 | 0 | 0 | 0 | 0 | 0 |
| | antifoaming agent | 1 | 1 | 1 | 1 | 1 | 1 | 1 | 1 |
| | melamine | 2 | 2 | 2 | 2 | 2 | 2 | 2 | 2 |
| Evaluation | tackiness | A | A | A | A | A | B | B | B |
| | lower portion curability (μm) | 75 | 75 | 75 | 75 | 75 | 50 | 50 | 50 |
| | smoothness | good | good | good | good | good | good | good | good |
| | crack resistance | A | A | A | A | A | A | A | A |
| | storage stability | A | A | A | A | A | A | A | A |
| | photosensitivity | 5 | 5 | 6 | 6 | 5 | 6 | 6 | 6 |
| | heat-yellowing resistance | A | A | A | A | A | A | A | A |
| | alkali-resistance | A | A | A | A | A | A | A | A |
| | adhesion | B | A | A | A | A | A | A | A |
| | pencil hardness | 5H | 5H | 5H | 5H | 5H | 5H | 5H | 5H |

TABLE 2

| | | Examples | | | | Comparative Examples | | | |
|---|---|---|---|---|---|---|---|---|---|
| | | 9 | 10 | 11 | 12 | 1 | 2 | 3 | 4 |
| Composition/ parts by mass | carboxyl group-containing resin A | 0 | 80 | 80 | 0 | 80 | 80 | 80 | 80 |
| | carboxyl group-containing resin B | 80 | 0 | 0 | 0 | 0 | 0 | 0 | 0 |
| | carboxyl group-containing resin C | 0 | 0 | 0 | 80 | 0 | 0 | 0 | 0 |

TABLE 2-continued

|  |  | Examples | | | | Comparative Examples | | | |
| --- | --- | --- | --- | --- | --- | --- | --- | --- | --- |
|  |  | 9 | 10 | 11 | 12 | 1 | 2 | 3 | 4 |
|  | photopolymerization initiator (IRGACURE819) | 4 | 4 | 3 | 4 | 5 | 4 | 6 | 0 |
|  | photopolymerization initiator (DAROCUR1173) | 10 | 10 | 0 | 10 | 15 | 8 | 0 | 10 |
|  | photopolymerization initiator (DAROCURE MBF) | 0 | 0 | 10 | 0 | 0 | 0 | 0 | 0 |
|  | photopolymerization initiator (IRGACURE184) | 6 | 6 | 6 | 6 | 0 | 0 | 14 | 6 |
|  | photopolymerization initiator (DAROCUR TPO) | 0 | 0 | 0 | 0 | 0 | 0 | 0 | 4 |
|  | rutile titanium dioxide R-90 | 80 | 80 | 80 | 80 | 80 | 80 | 80 | 80 |
|  | rutile titanium dioxide R-79 | 0 | 0 | 0 | 0 | 0 | 0 | 0 | 0 |
|  | epoxy compound TEPIC-SP | 7 | 7 | 7 | 7 | 7 | 15 | 7 | 7 |
|  | organic solvent | 5 | 5 | 5 | 5 | 5 | 0 | 5 | 5 |
|  | photopolymerizable monomer DPHA | 35 | 0 | 20 | 10 | 20 | 15 | 20 | 20 |
|  | photopolymerizable monomer TMPTA | 0 | 10 | 0 | 0 | 0 | 0 | 0 | 0 |
|  | antifoaming agent | 1 | 1 | 1 | 1 | 1 | 1 | 1 | 1 |
|  | melamine | 2 | 2 | 2 | 2 | 2 | 2 | 2 | 2 |
| Evaluation | tackiness | A | B | A | B | C | A | A | A |
|  | lower portion curability (μm) | 75 | 75 | 75 | 50 | 50 | 75 | 50 | 125 |
|  | smoothness | good | good | good | good | good | good | good | poor |
|  | crack resistance | A | A | A | A | B | B | B | C |
|  | storage stability | A | A | A | A | A | C | C | A |
|  | photosensitivity | 6 | 6 | 5 | 6 | 6 | 5 | 6 | 6 |
|  | heat-yellowing resistance | A | A | A | B | A | B | B | A |
|  | alkali-resistance | A | A | A | A | B | B | A | A |
|  | adhesion | A | A | A | A | C | C | B | A |
|  | pencil hardness | 5H | 5H | 5H | 6H | 5H | 5H | 5H | 5H |

As described in Tables above, in the examples 1 to 12, the storage stability of the liquid solder resist composition was good, and the tackiness of the dried coating film made of the liquid solder resist composition was a low.

On the other hand, in the comparative example 1, 2-hydroxy-2-methyl-1-phenyl-propane-1-one, which is the first α-hydroxyalkyl phenone-based photopolymerization initiator, was contained, but the second α-hydroxyalkyl phenone-based photopolymerization initiator was not contained, and thus the tackiness of the dried coating film was increased. In the comparative example 2, the amount of the first α-hydroxyalkyl phenone-based photopolymerization initiator was reduced, compared with the comparative example 1, and thus the tackiness of the dried coating film was reduced, whereas the storage stability of the liquid solder resist composition decreased. Also, in the comparative example 3, 1-hydroxy-cyclohexyl-phenyl-ketone, which is the second α-hydroxyalkyl phenone-based photopolymerization initiator, was contained, but the first α-hydroxyalkyl phenone-based photopolymerization initiator was not contained, and thus the storage stability of the liquid solder resist composition was low. According to this result, it was found that a combination of the first α-hydroxyalkyl phenone-based photopolymerization initiator and the second α-hydroxyalkyl phenone-based photopolymerization initiator could achieve good storage stability of the liquid solder resist composition and low tackiness of the dried coating film.

Also, in the examples 1 to 12, the lower portion curability and the smoothness was evaluated as being good, and thus an evaluation could be made that each of the solder resist layers in the examples 1 to 12 could be sufficiently cured entirely from its upper portion to its lower portion when the solder resist layer was formed by the dried coating film being exposed to light.

On the other hand, in the comparative example 4, the bisacylphosphine oxide-based photopolymerization initiator was not contained, and alternatively 2,4,6-trimethylbezoyl-diphenyl-phosphineoxide, which is monoacylphosphine oxide-based photopolymerization initiator, was contained, and thus the lower portion curability and the smoothness was evaluated as being poor. Therefore, an evaluation could be made that in the comparative example 4, when the solder resist layer was formed by the dried coating film being exposed to light, the solder resist layer could not be sufficiently cured from its upper portion to its lower portion. According to this result, it was found that a combination of the bisacylphosphine oxide-based photopolymerization initiator, the first α-hydroxyalkyl phenone-based photopolymerization initiator, and the second α-hydroxyalkyl phenone-based photopolymerization initiator makes it possible to sufficiently cure the solder resist layer entirely from its upper portion to its lower portion when the solder resist layer was formed by the dried coating film being exposed to light.

The invention claimed is:
1. A liquid solder resist composition containing:
   a carboxyl group-containing resin,
   a photopolymerizable compound containing at least one compound selected from a group consisting of a photopolymerizable monomer and a photopolymerizable prepolymer,
   a photopolymerization initiator,
   a titanium dioxide, and a thermosetting component, wherein the photopolymerization initiator consists of a bisacylphosphine oxide-based photopolymerization initiator, a first α-hydroxyalkyl phenone-based photopolymerization initiator that is a liquid at 25° C., and a second α-hydroxyalkyl phenone-based photopolymerization initiator that is a solid at 25° C., wherein the thermosetting component contains a compound having a cyclic ether skeleton, and the compound having the cyclic ether skeleton contains a triglycidyl isocyanurate, and wherein a mass ratio of the bisacylohosphine oxide-based photopolymerization initiator and the first α-hydroxyalkyl phenone-based photopolymerization initiator is within a range of 1:0.5 to 1:5, and a mass ratio of the bisacylphosphine oxide-based photopolymerization initiator and the second α-hydroxyalkyl phenone-based photopolymerization initiator is within a range of 1:0.5 to 1:5.

2. The liquid solder resist composition according to claim 1, wherein the first α-hydroxyalkyl phenone-based photopolymerization initiator contains 2-hydroxy-2-methyl-1-phenyl-propane-1-one, and the second α-hydroxyalkyl phenone-based photopolymerization initiator contains 1-hydroxycyclohexyl phenyl ketone.

3. The liquid solder resist composition according to claim 1, wherein the titanium dioxide contains a rutile titanium dioxide.

4. The liquid solder resist composition according to claim 1, wherein the titanium dioxide is within a range of 15 to 500 parts by mass relative to 100 parts by mass of the carboxyl group-containing resin.

5. The liquid solder resist composition according to claim 1, wherein the carboxyl group-containing resin contains a photopolymerizable carboxyl group-containing resin having a carboxyl group and a photopolymerizable functional group.

6. The liquid solder resist composition according to claim 5, wherein the photopolymerizable carboxyl group-containing resin contains a carboxyl group-containing (meth)acrylic copolymer resin.

7. A covered-printed wiring board, comprising a printed-wiring board and a solder resist layer that covers the printed-wiring board, wherein the solder resist layer is made of the liquid solder resist composition according to claim 1.

* * * * *